US011448968B2

(12) United States Patent
Holderer et al.

(10) Patent No.: US 11,448,968 B2
(45) Date of Patent: Sep. 20, 2022

(54) BEAM-FORMING AND ILLUMINATING SYSTEM FOR A LITHOGRAPHY SYSTEM, LITHOGRAPHY SYSTEM, AND METHOD

(71) Applicant: Carl Zeiss SMT GmbH, Oberkochen (DE)

(72) Inventors: Hubert Holderer, Oberkochen (DE); Klaus Abele, Schwäbisch-Gmünd Hussenhofen (DE); Björn Liebaug, Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 17/019,931

(22) Filed: Sep. 14, 2020

(65) Prior Publication Data

US 2021/0003925 A1 Jan. 7, 2021

Related U.S. Application Data

(63) Continuation of application No. PCT/EP2019/055594, filed on Mar. 6, 2019.

(30) Foreign Application Priority Data

Mar. 15, 2018 (DE) .......................... 102018203925.9

(51) Int. Cl.
*G03F 7/20* (2006.01)
(52) U.S. Cl.
CPC ...... *G03F 7/70141* (2013.01); *G03F 7/70033* (2013.01); *G03F 7/70891* (2013.01)

(58) Field of Classification Search
CPC ............. G03F 7/70141; G03F 7/70133; G03F 7/70825
See application file for complete search history.

(56) References Cited

U.S. PATENT DOCUMENTS

| | | | | |
|---|---|---|---|---|
| 2002/0163741 A1* | 11/2002 | Shibazaki | .............. | G02B 7/022 359/819 |
| 2005/0140947 A1* | 6/2005 | Miyajima | ........... | G03F 7/70891 355/30 |
| 2011/0235015 A1* | 9/2011 | Dengel | ............... | G03F 7/70558 355/71 |
| 2011/0317140 A1* | 12/2011 | Sigel | ...................... | G02B 13/16 355/53 |

(Continued)

FOREIGN PATENT DOCUMENTS

| DE | 10 2011 114 123 A1 | 4/2012 |
|---|---|---|
| DE | 10 2016 203 990 A1 | 9/2017 |

OTHER PUBLICATIONS

Translation of International Search Report for corresponding Appl No. PCT/EP2019/055594, dated Jul. 9, 2019.

*Primary Examiner* — Steven Whitesell Gordon
(74) *Attorney, Agent, or Firm* — Fish & Richardson P.C.

(57) ABSTRACT

A beam-forming and illuminating system for a lithography system, such an EUV lithography system, includes an optical element and an adjusting device. The adjusting device is configured so that, during a heat-up phase of the beam-forming and illuminating system, the adjusting device measures a field position and/or a pupil position of the beam-forming and illuminating system and adjusts the orientation and/or position of the optical element based on the measured field position and/or pupil position to keep the optical element in a desired position.

20 Claims, 9 Drawing Sheets

(56) References Cited

U.S. PATENT DOCUMENTS

| | | | |
|---|---|---|---|
| 2013/0182344 A1* | 7/2013 | Pnini-Mittler | B25J 9/1623 359/871 |
| 2014/0009764 A1* | 1/2014 | Emer | G03F 7/70191 356/456 |
| 2016/0342097 A1 | 11/2016 | Conradi et al. | |
| 2018/0373158 A1 | 12/2018 | Baier et al. | |

* cited by examiner

BEAM-FORMING AND ILLUMINATING SYSTEM FOR A LITHOGRAPHY SYSTEM, LITHOGRAPHY SYSTEM, AND METHOD

CROSS-REFERENCE TO RELATED APPLICATIONS

The present application is a continuation of, and claims benefit under 35 USC 120 to, international application PCT/EP2019/055594, filed Mar. 6, 2019, which claims benefit under 35 USC 119 of German Application No. 10 2018 203 925.9, filed Mar. 15, 2018. The entire disclosure of these applications are incorporated by reference herein.

FIELD

The present disclosure relates to a beam-shaping and illumination system for a lithography apparatus, to a lithography apparatus with such a beam-shaping and illumination system, and to a method for adjusting such a beam-shaping and illumination system.

BACKGROUND

Microlithography is used for producing microstructured components, for example integrated circuits. The microlithography process is performed using a lithography apparatus, which has an illumination system and a projection system. The image of a mask (reticle) illuminated via the illumination system is in this case projected via the projection system onto a substrate (for example a silicon wafer) which is coated with a light-sensitive layer (photoresist) and arranged in the image plane of the projection system, in order to transfer the mask structure to the light-sensitive coating of the substrate.

Driven by the desire for ever smaller structures in the production of integrated circuits, EUV lithography apparatuses that use light with a wavelength in the range from 0.1 nm to 30 nm, for example 13.5 nm, are currently under development. In the case of such EUV lithography apparatuses, because of the high absorption of light of this wavelength by most materials, reflective optical units, that is to say mirrors, are typically used instead of—as previously—refractive optical units, that is to say lens elements.

Often, it may be desirable after some time of exposure operation to swap individual optical units. For example, in exposure operation, tin can enter the illumination system from an EUV light source that operates with a tin plasma. This can lead to degradation of the optical units. The swapping of individual optical units is desirably possible without dismantling and installing the entire illumination system and optionally at the operating site of the EUV lithography apparatus and with the shortest possible downtime. After the swap, it may be desirable to adjust the optical units in order to achieve an optimum field position and pupil position for the exposure operation. Furthermore, it can also be desirable to already adjust the optical units during a heating phase of the illumination system in order to achieve an optimum field position and pupil position even during the heating phase. This would allow starting the exposure operation during the heating phase in order to achieve the shortest possible downtime.

DE 10 2016 203 990 A1 describes a method for producing an illumination system for an EUV lithography apparatus. The method includes adjusting a location of mirror modules of an illumination system of the EUV lithography apparatus. The mirror modules are adjusted here based on measured values from a mobile measurement system.

SUMMARY

The present disclosure seeks to provide an improved beam-shaping and illumination system for a lithography apparatus.

In an aspect, the disclosure provides a beam-shaping and illumination system for a lithography apparatus, for example, for an EUV lithography apparatus that includes an optical element and an adjustment device which is configured to measure a field position and/or a pupil position of the beam-shaping and illumination system during a heating phase of the beam-shaping and illumination system and to adjust, in dependence on the measured field position and/or pupil position, an orientation and/or a position of the optical element in order to keep the optical element in a target location.

Because the optical element is adjusted during the heating phase, an exposure operation of the beam-shaping and illumination system or the lithography apparatus can be started during the heating phase. As a result, the downtime of the beam-shaping and illumination system or the lithography apparatus, for example after the optical element has been swapped, can be significantly reduced. The adjustment of the optical element can thus be readjusted during the ongoing exposure operation. The optical element can be kept in its specification independently of its temperature with the aid of the adjustment device.

In some embodiments, measurements can be carried out during the ongoing exposure operation, and the pupil position can be readjusted. For example, the measurements can be carried out in in a predetermined time interval, for example in a time interval of two hours. Any deviation of the optical element from its target location can then be readjusted in each case within this time interval. The optical element can advantageously be adjusted when exchanging a wafer stack (or: lot) or even when exchanging a wafer. This allows time to be saved. Furthermore, measurements from an exposure operation carried out earlier or a heating phase carried out earlier can also be used to adjust the optical element. In this way, measurements during the heating phase can be dispensed with. This likewise helps saves time.

In some embodiments, the adjustment device is configured to continuously adjust the orientation and/or position of the optical element during the heating phase of the beam-shaping and illumination system in dependence on the measured field position and/or pupil position in order to keep the optical element in the target location. "Continuously" is preferably to be understood here as meaning that the optical element can be adjusted with the aid of the adjustment device during the entire or at least during a large part of the heating phase.

The heating phase can last a number of hours. The heating phase lasts, for example, until a thermal equilibrium of the beam-shaping and illumination system due to incident EUV radiation is attained. In the present case, "thermal equilibrium" is to be understood to be a state in which the temperature of the beam-shaping and illumination system or of the optical element no longer increases and in particular remains constant. An equilibrium is then attained between the heat introduced, for example due to absorption of the EUV radiation, and heat that is removed, for example with the aid of a cooling system. The thermal equilibrium can also be referred to as thermal saturation. The thermal equilibrium can be reached after a number of hours, for example after one to five hours.

The beam-shaping and illumination system can be referred to as an optical system, and vice versa. The beam-shaping and illumination system usually includes a plurality of optical elements, for example a field facet mirror, a pupil facet mirror, and a condenser mirror. Each optical element can be a mirror module or be referred to as a mirror module. A photo mask can be arranged in an object plane of the beam-shaping and illumination system. An object field is positioned in the object plane. A position of this object field in the object plane is referred to as the field position of the beam-shaping and illumination system. A position of an entrance pupil of a projection system of the lithography apparatus is referred to as the pupil position of the beam-shaping and illumination system.

As mentioned above, the optical element can be a facet mirror. A facet mirror can include a multiplicity of facets that can be arranged in the form of a line or an array. By way of example, a facet mirror can have hundreds to thousands of facets. Each facet is individually positionable or adjustable. For this purpose, an actuator or actuating element, for example what is known as a Lorentz actuator, can be assigned to each facet. Such a Lorentz actuator can include a magnetic element coupled to in each case one facet with the aid of a plunger. The magnetic element can be deflected and the facet can thus be adjusted with the aid of a plurality of energized coils. For example, a Lorentz actuator pre-defines a force, but not a fixed path. The optical element can therefore be a module or a unit with a multiplicity of facets and actuators and accordingly has a large thermal mass. The optical element can thus be a mirror array and can be adjusted or modulated as a whole. The orientation and/or the position of the optical element can deviate from its target location due to its warming during the heating phase and should therefore be readjusted.

The above-described adjustment of the optical element can in principle also be carried out with the aid of an adjustment of the individual facets. However, in general, this would be at the expense of the deflection range of the facets. The adjustment device can therefore adjust the entire optical element including the facets as a unit during the heating phase. An individual adjustment of the facets that restricts the deflection range can thus be dispensed with. However, this does not rule out that a combined adjustment can also take place with the aid of the adjustment device and at the same time with the aid of the individual facets. For example, the entire optical element can be pre-adjusted with the aid of the adjustment device, wherein a fine adjustment can then be made with the aid of an adjustment of the individual facets. This means that serial kinematics of the adjustment device and of the individual actuating elements of the facets can be provided. As a result, the deflection range of the individual facets is optionally not overly restricted. At the same time, a path to be realized by the adjustment device, which path is used to hold the optical element in the target location and/or to bring it into the target location, can be reduced. An actuating element of the adjustment device can thus be dimensioned smaller.

The optical element or an optically effective surface, for example a mirror surface, of the optical element optionally has six degrees of freedom, which includes three translational degrees of freedom in each case along a first spatial direction or x-direction, a second spatial direction or y-direction, and a third spatial direction or z-direction, and also three rotational degrees of freedom each about the x-direction, the y-direction, and the z-direction. That is to say, the position and the orientation of the optical element or of the optically effective surface can be determined or described with the aid of the six degrees of freedom. The adjustment device is suitable for adjusting the optical element in all six degrees of freedom.

"Adjustment" should accordingly be understood to mean that preferably both the orientation and the position of the optical element can be changed with the aid of the adjustment device in order to keep the optical element or the optically effective surface in the target location. If the optical element is not in the target location but in an actual location deviating therefrom, the field position and/or the pupil position do not meet the specifications used for the exposure operation, for example illumination specifications. The adjustment device then adjusts the optical element until it has been moved from the actual location to the target location. The optical element can thus be adjusted in such a way that the field position and/or the pupil position meet the desired specifications, or the field position and/or the pupil position can be changed or adjusted by changing the location of the optical element.

The "position" of the optical element or of the optically effective surface should accordingly be understood to mean in particular the coordinates thereof or the coordinates of a measurement point provided on the optical element with respect to the x-direction, the y-direction, and the z-direction. The "orientation" of the optical element or of the optically effective surface should accordingly be understood to mean in particular its tilt with respect to the three spatial directions. That is to say that the optical element or the optically effective surface thereof can be tilted about the x-direction, the y-direction, and/or the z-direction. This results in the six degrees of freedom for the position and/or orientation of the optical element or of the optically effective surface. The "location" of the optical element or of the optically effective surface can encompass both its position and its orientation. That is to say, the orientation and/or the position can also be referred to collectively as the location, or the location can be referred to as the orientation and/or position. The terms "location" and "orientation and/or position" can thus be interchanged.

The fact that the adjustment device "holds" the optical element in the target location should be understood to mean that, using the measurement of the field position and/or the pupil position, the adjustment device always monitors whether the optical element is still in the target location and accordingly readjusts it if desired so that it is positioned again in the target location. The target location can be subject to tolerances. The tolerance is designed such that the field position and/or the pupil position meets the specifications when the actual location of the optical element lies within the tolerance field of the target location.

The adjustment device can include a measurement system for measuring the field position and/or the pupil position. The measurement system can include a computer unit for calculating a correction recipe according to which the optical element should be adjusted. The measurement system can be mobile. The measurement system can also be a fixed constituent part of the beam-shaping and illumination system. Furthermore, the adjustment device can also include an actuating element for continuously changing the orientation and/or the position of the optical element and a control unit for controlling the actuating element. The control unit is operatively connected to the measurement system. The control unit can be part of the measurement system, or the measurement system can be part of the control unit. The optical element is adjusted during the heating phase.

The measurement system can include a light-sensitive sensor system, for example one or more CCD (charge-coupled device) sensors. The sensor system can furthermore include, for example, a sensor for measuring the energy distribution in the object plane. For example, this sensor can be movable in the object plane so that it can be moved into a beam path of the beam-shaping and illumination system to measure the field position and/or the pupil position in the object plane. After the measurement, the sensor can be moved out of the beam path again. Alternatively, the sensor system can also include a photomask (reticle), which is provided with measurement technology and can likewise be moved in the object plane, for measuring the field position and/or the pupil position.

According to some embodiments, the beam-shaping and illumination system further includes a plurality of optical elements, such as a field facet mirror, a pupil facet mirror, and/or a condenser mirror, wherein the adjustment device is configured to adjust an orientation and/or a position of the optical elements relative to one another in dependence on the measured field position and/or pupil position.

The adjustment can be carried out continuously. The number of the optical elements is arbitrary. Three optical elements can be provided, including a field facet mirror, a pupil facet mirror, and a condenser mirror. However, four or more than four optical elements can also be provided. As mentioned above, a facet mirror includes, for example, a multiplicity of facets, which can be arranged in the form of lines. The facets can be curved arcuately or in a crescent-shaped fashion. The facets can also be polygonal, for example hexagonal. By way of example, a facet mirror can have hundreds to thousands of facets. Each facet can be individually tiltable.

According to some embodiments, the beam-shaping and illumination system further includes a bearing device, such as a hexapod, for the optical element, wherein the bearing device includes an actuating element, such as a piezo element, that is controllable by the adjustment device.

The bearing device can be referred to as a hexapod, or the hexapod can be referred to as a bearing device. The control element can also be referred to as an actuator. A dedicated bearing device of this type is assigned to each optical element. The optical element can include a mount in which the optical element is held. The optical element can be decoupled from this mount, for example mechanically decoupled. The bearing device is preferably coupled to the mount. The bearing device operatively connects the mount to a base of the beam-shaping and illumination system. The base can also be called a fixed world. The base can be a force frame of the beam-shaping and illumination system or of the lithography apparatus. The bearing device permits the optical element to be supported in the six degrees of freedom mentioned above. The actuating element can include one or more piezo elements or can be a piezo element. The actuating element can alternatively be or include a threaded spindle that is adjustable manually or by motor. Furthermore, the actuating element can also include a hydraulic or pneumatic drive. In the event that the actuating element is a piezo element, the driving can take place directly or via a solid-state gear to optimize force, travel and actuating accuracy. Furthermore, the actuating element can include a piezoelectric walk drive, which can be combined with a solid-state gear to optimize force, travel and actuating accuracy.

According to some embodiments, the bearing device includes six bearing units, each with an actuating element.

That is to say, at least one such actuating element can be assigned to each bearing unit. The actuating elements are able to be controlled, for example energized, by the adjustment device, for example by the control unit of the adjustment device, in order to change the orientation and/or the position of the optical element in all six degrees of freedom. Each actuating element allows, for example, a linear movement along a longitudinal direction or a pin axis of the bearing unit assigned to the respective actuating element.

According to some embodiments, each bearing unit includes a spacer that changes a length of the respective bearing unit.

The spacer can also be referred to as a shim. Spacers with different gradations or granularities in terms of the extent of their lengths in relation to the longitudinal direction or the pin axis of the respective bearing unit can be kept available, from which a suitable spacer is then selected. The granularity of the spacers can be 5 μm.

According to some embodiments, a change in length of the bearing units can be carried out to adjust the orientation and/or the position of the optical element.

The change in length can encompass an increase in length or a reduction in length. The change in length can, but does not have to, be carried out in two stages. With the aid of the spacer, the change in length can be effected in a first stage on the basis of the previously described granularity with an accuracy of 5 μm. In a second stage, an accuracy of up to 0.1 μm can be achieved with the aid of the actuating element. In the event that the desired change in length is less than 5 μm, it is also possible to dispense with the insertion of the spacer. For example, the spacer can be dispensed with if a pre-adjustment has already been carried out and therefore only a desired change in length of less than 5 μm is to be expected.

According to some embodiments, the actuating element is able to be brought from an undeflected state into a deflected state, wherein the actuating element is without current both in the undeflected state and in the deflected state.

The actuating element can be what is known as a piezo crawler or include such a piezo crawler. The undeflected state can also be referred to as the non-actuated state, and the deflected state can also be referred to as the actuated state. By applying a voltage to the actuating element, which can include a piezoceramic, the latter undergoes a change in length. A further effect in the case of piezoceramics is that they also undergo a change in length in the case of a polarization. This change in length is permanent and can only be changed by changing the polarization. That is to say, after the length has changed, especially in the deflected state, no more introduction of energy is involved to maintain the change in length. This also means that no heat that has to be dissipated is generated. As mentioned above, the actuating element is only energized to bring it from the undeflected state to the deflected state and vice versa. Outside of that, the control element is not energized. This means that no current is used to maintain the deflected state. An actuating region of the actuating element can be continuously settable here. That is to say, the actuating element can be brought into any number of intermediate states between the undeflected state and the deflected state, preferably continuously.

According to some embodiments, each bearing unit includes a first bending decoupling element, a second bending decoupling element, and a pin section arranged between the first bending decoupling element and the second bending decoupling element, wherein the actuating element is arranged between the first bending decoupling element and the second bending decoupling element, between the first bending decoupling element and the optical element, or between the second bending decoupling element and a base of the beam-shaping and illumination system.

That is to say, the actuating element can be arranged in the pin section and/or be part of the pin section. The pin section and the bending decoupling elements are preferably formed in one piece, for example in one piece of material. The bending decoupling elements can each include flexure bearings or be designed as flexure bearings. In the present case, a "flexure bearing" should preferably be understood to mean a spring device that allows a relative movement due to bending or—more generally—due to elastic deformation. The function of such a flexure bearing is achieved for example by a region of reduced flexural rigidity, for example a resiliently deformable region with reduced material thickness, relative to two adjoining regions of higher flexural rigidity. The reduced flexural rigidity can thus be brought about by a local reduction in cross section. The previously mentioned spacer can be positioned between the first bending decoupling element and the optical element or its mount or between the second bending decoupling element and the base. The spacer can be positioned adjacent to the actuating element or at the bending decoupling element on which the actuating element is not provided.

Furthermore, a lithography apparatus, such as an EUV lithography apparatus, with such a beam-shaping and illumination system is proposed.

In addition to the beam-shaping and illumination system, the lithography apparatus can include a projection system and a light source, such as an EUV light source. EUV stands for "extreme ultraviolet" and denotes a wavelength of the working light of between 0.1 nm and 30 nm. The lithography apparatus can also be a DUV lithography apparatus. DUV stands for "deep ultraviolet" and denotes a wavelength of the working light of between 30 nm and 250 nm.

Furthermore, a method for adjusting such a beam-shaping and illumination system for a lithography apparatus is proposed. The method includes the steps: a) measuring a field position and/or a pupil position of the beam-shaping and illumination system, and b) adjusting an orientation and/or a position of an optical element of the beam-shaping and illumination system during a heating phase of the beam-shaping and illumination system in dependence on the measured field position and/or pupil position in such a way that the optical element is held in a target location.

The adjustment in step b) can be carried out continuously. Steps a) and b) can be carried out with the aid of the adjustment device. For this purpose, the adjustment device includes the measurement system and the control unit for controlling the actuating elements. Step a) can be carried out using working light, that is to say, for example, EUV radiation, of the lithography apparatus. Step a) can alternatively be carried out with the aid of measurement light from a measurement light source of the measurement system. In this case, the measurement light is for example not EUV radiation. For example, the measurement light is a laser beam. The measurement light can, for example, be coupled into the beam path of the beam-shaping and illumination system at an intermediate focal plane of the beam-shaping and illumination system and coupled out of it again upstream of the object plane. For this purpose, an input-coupling device and an output-coupling device, which are each designed, for example, as a motor-driven mirror, can be used. In step a), however, the measurement of the field position and/or the pupil position can be carried out with the aid of the EUV radiation, since in that case an additional measurement light source can advantageously be dispensed with. This means that the EUV light source is in operation while the method is being carried out.

According to some embodiments, steps a) and b) are carried out iteratively until the field position and/or the pupil position meet a desired specification.

This means that the field position and/or the pupil position can be adapted with the aid of the method. The specification preferably encompasses a tolerance range within which the field position and/or the pupil position should lie.

According to some embodiments, a correction recipe for the optical element is calculated before or in step b), wherein the optical element is adjusted based on this correction recipe.

The correction recipe can be calculated with the aid of the aforementioned computer unit, which can be part of the adjustment device. The correction recipe can include for each bearing unit of the bearing device of the respective optical element a statement as to whether and to what extent a change in length is desired for the respective bearing unit in order to keep the respective optical element in the target location.

According to some embodiments, the method is carried out under a vacuum and/or during the operation of an EUV light source of the beam-shaping and illumination system.

The optical element or the optical elements can be positioned in a housing of the beam-shaping and illumination system. This housing can be subjected to a vacuum during the exposure operation and during the heating phase.

According to some embodiments, the orientation and/or the position of the optical element is adjusted in step b) by in each case carrying out a change in length for bearing units of a bearing device of the optical element.

The change in length can be carried out with the aid of inserting the aforementioned spacer and/or with the aid of controlling the actuating element of the respective bearing unit.

According to some embodiments, the method is carried out until a thermal equilibrium of the beam-shaping and illumination system is attained.

As soon as the thermal equilibrium is attained, for example after one to five hours, the process can be terminated. The actuating element can then be de-energized. The measurement system and/or the control unit may then be removed from the beam-shaping and illumination system, if so desired. Alternatively, the measurement system and/or the control unit can also remain at the beam-shaping and illumination system.

The embodiments and features described for the beam-shaping and illumination system apply accordingly to the proposed method and vice versa.

"A(n)" in the present case should not necessarily be understood as restrictive to exactly one element. Rather, a plurality of elements, such as, for example, two, three or more, can also be provided. Any other numeral used here should not be understood to the effect that an exact restriction to exactly the corresponding number of elements must be realized. Rather, numerical deviations upwards and downwards are possible.

Further possible implementations of the disclosure also include not explicitly mentioned combinations of features or embodiments that are described above or below with respect to the exemplary embodiments. In this case, a person skilled in the art will also add individual aspects as improvements or supplementations to the respective basic form of the disclosure.

Further configurations and aspects of the disclosure are provided herein, including in the exemplary embodiments of the disclosure described below.

BRIEF DESCRIPTION OF THE DRAWINGS

In the text that follows, the disclosure is explained in more detail on the basis of exemplary embodiments and with reference to the accompanying figures.

DESCRIPTION OF EXEMPLARY EMBODIMENTS

Identical elements or elements having an identical function have been provided with the same reference signs in the figures, unless indicated to the contrary. It should also be noted that the illustrations in the figures are not necessarily true to scale.

Figure 1A:
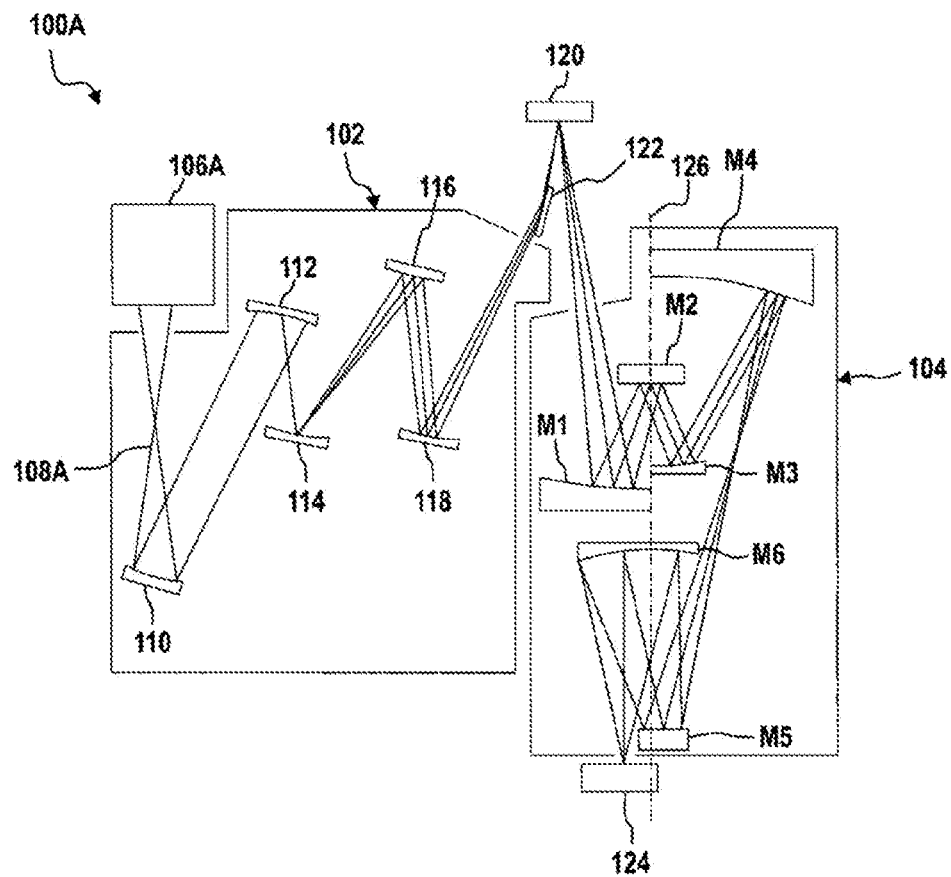
FIG. 1A shows a schematic view of an EUV lithography apparatus.

FIG. 1A shows a schematic view of an EUV lithography apparatus 100A including a beam-shaping and illumination system 102 and a projection system 104. In this case, EUV stands for "extreme ultraviolet" and denotes a wavelength of the working light of between 0.1 nm and 30 nm. The beam-shaping and illumination system 102 and the projection system 104 are respectively provided in a vacuum housing (not shown), wherein each vacuum housing is evacuated with the aid of an evacuation apparatus (not shown). The vacuum housings are surrounded by a machine room (not shown), in which drive devices for mechanically moving or setting optical elements are provided. Moreover, electrical controllers and the like can also be provided in this machine room.

The EUV lithography apparatus 100A includes an EUV light source 106A. A plasma source (or a synchrotron), which emits radiation 108A in the EUV range (extreme ultraviolet range), that is to say for example in the wavelength range of 5 nm to 20 nm, can for example be provided as the EUV light source 106A. In the beam-shaping and illumination system 102, the EUV radiation 108A is focused and the desired operating wavelength is filtered out from the EUV radiation 108A. The EUV radiation 108A generated by the EUV light source 106A has a relatively low transmissivity through air, for which reason the beam-guiding spaces in the beam-shaping and illumination system 102 and in the projection system 104 are evacuated.

The beam-shaping and illumination system 102 illustrated in FIG. 1A has five mirrors 110, 112, 114, 116, 118. After passing through the beam-shaping and illumination system 102, the EUV radiation 108A is guided onto a photomask (reticle) 120. The photomask 120 is likewise embodied as a reflective optical element and can be arranged outside the systems 102, 104. Furthermore, the EUV radiation 108A can be directed onto the photomask 120 via a mirror 122. The photomask 120 has a structure which is imaged onto a wafer 124 or the like in a reduced fashion via the projection system 104.

The projection system 104 (also referred to as a projection lens) has six mirrors M1 to M6 for imaging the photomask 120 onto the wafer 124. In this case, individual mirrors M1 to M6 of the projection system 104 can be arranged symmetrically in relation to an optical axis 126 of the projection system 104. It should be noted that the number of mirrors M1 to M6 of the EUV lithography apparatus 100A is not restricted to the number represented. A greater or lesser number of mirrors M1 to M6 can also be provided. Furthermore, the mirrors M1 to M6 are generally curved at their front sides for beam shaping.

Figure 1B:
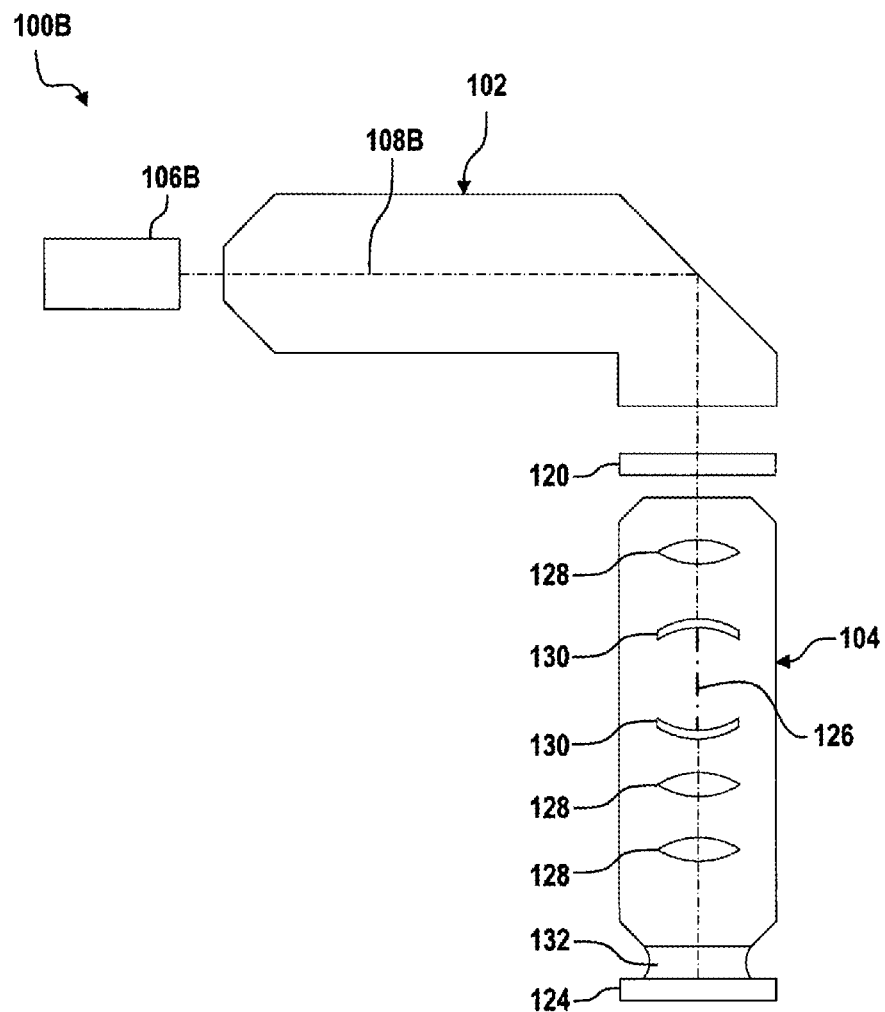
FIG. 1B shows a schematic view of of a DUV lithography apparatus.

FIG. 1B shows a schematic view of a DUV lithography apparatus 100B, which includes a beam-shaping and illumination system 102 and a projection system 104. In this case, DUV stands for "deep ultraviolet" and denotes a wavelength of the working light of between 30 nm and 250 nm. As has already been described with reference to FIG. 1A, the beam-shaping and illumination system 102 and the projection system 104 can be arranged in a vacuum housing and/or be surrounded by a machine room with corresponding drive devices.

The DUV lithography apparatus 100B has a DUV light source 106B. By way of example, an ArF excimer laser that emits radiation 108B in the DUV range at 193 nm, for example, can be provided as the DUV light source 106B.

The beam-shaping and illumination system 102 illustrated in FIG. 1B guides the DUV radiation 108B onto a photomask 120. The photomask 120 is embodied as a transmissive optical element and can be arranged outside the systems 102, 104. The photomask 120 has a structure which is imaged onto a wafer 124 or the like in a reduced fashion via the projection system 104.

The projection system 104 has a plurality of lens elements 128 and/or mirrors 130 for imaging the photomask 120 onto the wafer 124. In this case, individual lens elements 128 and/or mirrors 130 of the projection system 104 can be arranged symmetrically in relation to an optical axis 126 of the projection system 104. It should be noted that the number of lens elements 128 and mirrors 130 of the DUV lithography apparatus 100B is not restricted to the number represented. A greater or lesser number of lens elements 128 and/or mirrors 130 can also be provided. Furthermore, the mirrors 130 are generally curved at their front side for beam shaping.

An air gap between the last lens element 128 and the wafer 124 can be replaced by a liquid medium 132 which has a refractive index of >1. The liquid medium 132 can be high-purity water, for example. Such a construction is also referred to as immersion lithography and has an increased photolithographic resolution. The medium 132 can also be referred to as an immersion liquid.

Figure 2:
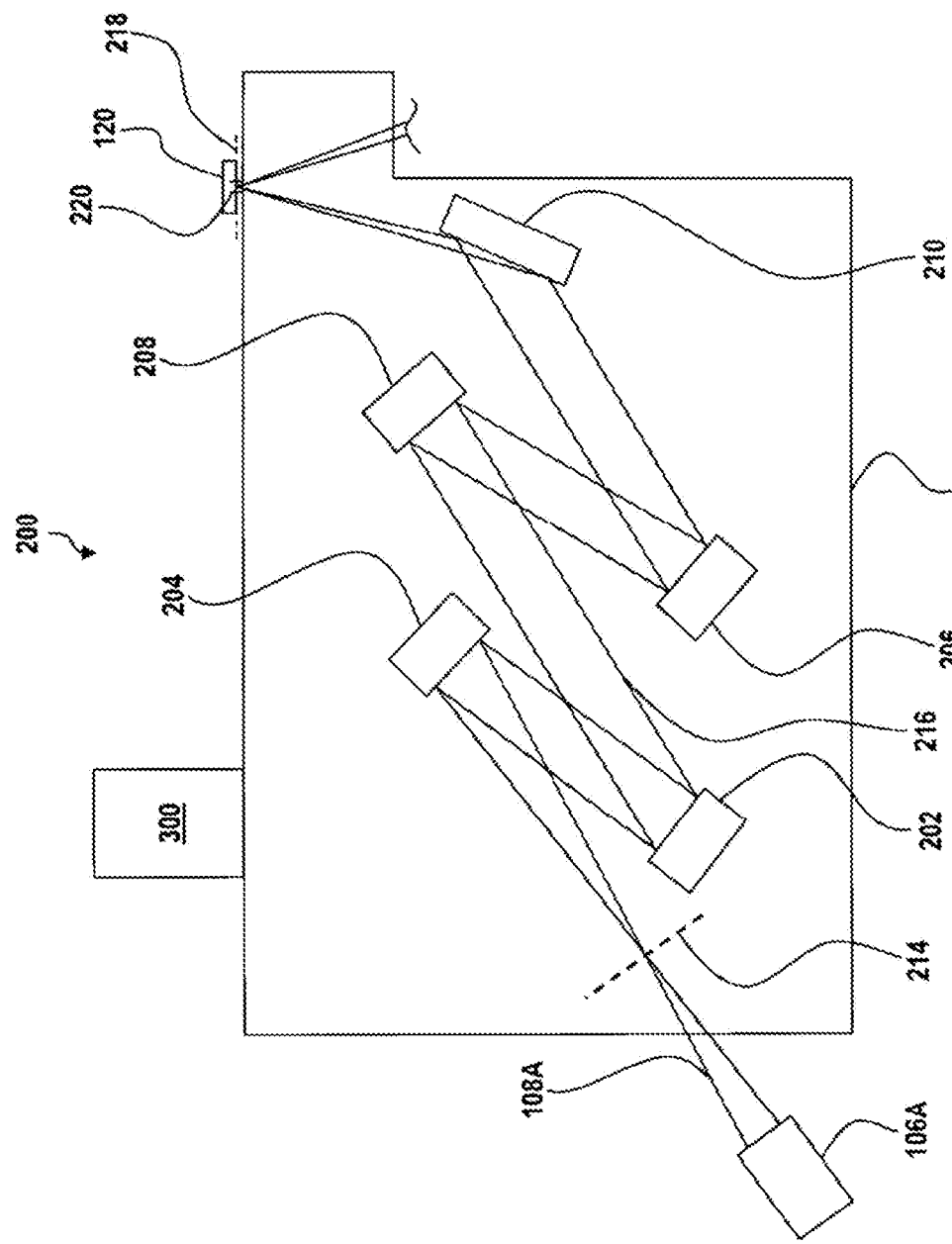
FIG. 2 shows a schematic view of of an optical system for the lithography apparatus in accordance with FIG. 1A or FIG. 1B.

FIG. 2 shows a schematic view of an optical system 200. The optical system 200 is a beam-shaping and illumination system 102, for example a beam-shaping and illumination system 102 of an EUV lithography apparatus 100A. The optical system 200 can therefore also be called a beam-shaping and illumination system, and the beam-shaping and illumination system 102 can be called an optical system. However, the optical system 200 can also be part of a DUV lithography apparatus 100B. However, it is assumed below that the optical system 200 is part of an EUV lithography apparatus 100A. In addition to the optical system 200, FIG. 2 also shows an EUV light source 106A, which emits EUV radiation 108A, and a photo mask 120.

The optical system 200 includes a plurality of optical elements 202, 204, 206, 208. Furthermore an optional deflection mirror 210 can be provided. The deflection mirror 210 is operated with grazing incidence and can therefore also be called a grazing incidence mirror. The deflection mirror 210 can correspond to the mirror 122 shown in FIG. 1A. The optical elements 202, 204, 206, 208 can correspond to the mirrors 110, 112, 114, 116, 118 shown in FIG. 1A.

The optical element 202 can be a facet mirror, for example a pupil facet mirror, of the optical system 200. The optical element 204 can also be a facet mirror, for example a field facet mirror, of the optical system 200. At least one of the optical elements 206, 208 can be a condenser mirror of the optical system 200. The number of the optical elements 202, 204, 206, 208 is arbitrary. For example, as shown in FIG. 1A, five optical elements 202, 204, 206, 208 or, as shown in FIG. 2, four optical elements 202, 204, 206, 208 can be provided. However, at least three optical elements 202, 204, 206, 208, specifically a pupil facet mirror, a field facet mirror and a condenser mirror, are preferably provided.

A facet mirror includes a multiplicity of facets which can be arranged in the form of lines. The facets can be curved arcuately or in a crescent-shaped fashion. The facets can also be polygonal, for example hexagonal. By way of example, a facet mirror can have hundreds to thousands of facets. Each facet can be tiltable by itself.

The optical elements 202, 204, 206, 208 are arranged within a housing 212. The housing 212 can be subjected to a vacuum during operation, for example during exposure operation, of the optical system 200. That is to say, the optical elements 202, 204, 206, 208 are arranged in a vacuum.

During operation of the optical system 200, the EUV light source 106A emits EUV radiation 108A. By way of example, a tin plasma can be produced for this purpose. In order to produce the tin plasma, a tin body, for example a tin bead or a tin droplet, can be bombarded with a laser pulse. The tin plasma emits EUV radiation 108A, which is collected with the aid of a collector, for example an ellipsoidal mirror, of the EUV light source 106A and is sent in the direction of the optical system 200. The collector focuses the EUV radiation 108A at an intermediate focal plane 214. The EUV radiation 108A is reflected by each of the optical elements 202, 204, 206, 208 and the deflecting mirror 210 as it passes through the optical system 200. A beam path of the EUV radiation 108A is denoted by the reference sign 216.

The photomask 120 is arranged in an object plane 218 of the optical system 200. An object field 220 is positioned in the object plane 218. A position of the object field 220 in the object plane 218 is referred to as the field position. A position of an entrance pupil of a projection system 104 (not shown in FIG. 2) is referred to as the pupil position of the optical system 200.

FIG. 2 furthermore shows a mobile measurement system 300. The measurement system 300 can be provided on the outside of the housing 212. The measurement system 300 can be part of the optical system 200. However, the measurement system 300 is preferably not part of the optical system 200 and can be separated again from the optical system 200 after a measurement process. The measurement system 300 can be suitable for coupling measurement light, for example a laser beam, into the beam path 216 and, after it has passed through the optical elements 202, 204, 206, 208, coupling it out of it again. However, the measurement system 300 preferably works without its own measurement light source emitting the measurement light. That is to say, the measurement system 300 preferably works with the EUV radiation 108A.

In the event that the measurement system 300 nevertheless has a measurement light source, the latter is configured—as mentioned above—to emit measurement light. In this case, the measurement light is, for example, not EUV radiation 108A. Furthermore, the measurement system 300 then includes an input-coupling device for coupling the measurement light into the beam path 216. The input-coupling device can be a mirror that is movable or pivotable by motor. The measurement light can be coupled into the beam path 216 at the intermediate focal plane 214, for example, with the aid of the input-coupling device. The measurement system 300 has an output-coupling device for coupling the measurement light out of the beam path 216. The output-coupling device can also be a mirror that is movable or pivotable by motor. The measurement light can be coupled out of the beam path 216 again, preferably upstream of the object plane 218, with the aid of the output-coupling device. As mentioned above, the measurement system 300 can preferably also measure the field position and the pupil position with the EUV radiation 108A rather than with measurement light. As a result, a separate measurement light source and the input-coupling device, and the output-coupling device can be dispensed with.

The measurement system 300 further includes a light-sensitive sensor system, for example one or more CCD sensors (charge-coupled device). The measurement system 300 furthermore includes a computer unit. The field position and the pupil position can be determined or measured with the aid of the measurement system 300. The sensor system can include, for example, a sensor for measuring the energy distribution in the object plane 218. For example, the sensor can be movable in the object plane 218 such that it can be moved into the beam path 220 to measure the field position and/or the pupil position in the object plane 218. Alternatively, the sensor system can also include a photomask 120 (reticle), which is provided with measurement technology and can likewise be moved in the object plane 218.

Figure 3:
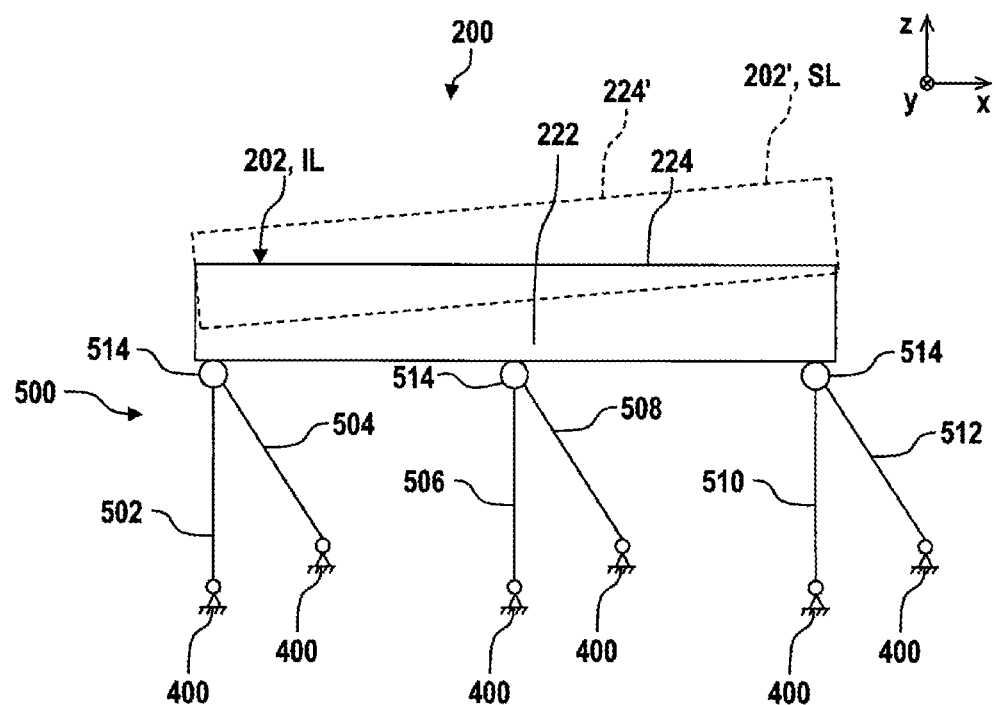
FIG. 3 shows a further schematic view of the optical system in accordance with FIG. 2.

FIG. 3 shows a further view of the optical system 200, but in this case only the optical element 202 is shown. The following statements relating to the optical element 202 apply accordingly to the optical elements 204, 206, 208. That is to say that the optical elements 202, 204, 206, 208 can be constructed identically, for example with regard to the way in which they are supported, which is explained below.

The optical element 202 includes a substrate 222 and an optically effective surface 224, for example a mirror surface. In the event that the optical element 202 is a facet mirror, the optically effective surface 224 can be provided on a multiplicity of facets. The optical element 202 or the optically effective surface 224 has six degrees of freedom, specifically three translational degrees of freedom in each case along a first spatial direction or x-direction x, a second spatial direction or y-direction y, and a third spatial direction or z-direction z, and also three rotational degrees of freedom each about the x-direction x, the y-direction y, and the z-direction z. That is to say that a position and an orientation of the optical element 202 or of the optically effective surface 224 can be determined or described with the aid of the six degrees of freedom.

The "position" of the optical element 202 or of the optically effective surface 224 is in particular understood to mean the coordinates thereof or the coordinates of a measurement point provided on the optical element 202 with respect to the x-direction x, the y-direction y, and the z-direction z. The "orientation" of the optical element 202 or of the optically effective surface 224 is understood to mean in particular its tilt with respect to the three spatial directions x, y, z. That is to say that the optical element 202 or the optically effective surface 224 can be tilted about the x-direction x, the y-direction y, and/or the z-direction z. This results in the six degrees of freedom for the position and/or orientation of the optical element 202 or of the optically effective surface 224. A "location" of the optical element 202 or of the optically effective surface 224 encompasses both its position and its orientation.

In FIG. 3, an actual location IL of the optical element 202 is shown with solid lines, and a target location SL of the optical element 202' or of the optically effective surface 224' is shown with dashed lines and the reference signs 202' and 224', respectively. In the actual location IL, the optical system 200 does not meet the specifications, for example, the illumination specifications, with regard to the field position and the pupil position. In the target location SL, the optical system 200 does meet the specifications with regard to the field position and the pupil position.

A base 400 is assigned to the optical system 200. The base 400 can also be called a fixed world. The base 400 can be a force frame of the optical system 200 or of the lithography apparatus 100A.

The optical element 202 can include a mount 226 (FIG. 4) in which the optical element is held. The optical element 202 can be decoupled from this mount 226, for example mechanically decoupled. In the present case, "mechanical decoupling" is to be understood to mean that no or at least only very small forces can be transmitted from the optical element 202 to the mount 226 and/or vice versa. As a result, for example due to different thermal expansion of the optical element 202 and the mount 226, only low stresses can be introduced into the optical element 202. Furthermore, the optical element 202 can also include a cooling system (not shown). The optical element 202 can therefore also be referred to as a module, for example as a mirror module.

For example, such a mechanical decoupling of the optical element 202 from its mount 226 can be effected with the aid of flexure bearings. In the present case, a "flexure bearing" should preferably be understood to mean a spring device that allows a relative movement due to bending or—more generally—due to elastic deformation. The elastic deformation of the respective flexure bearing can thus entail a relative movement of the optical element 202 relative to its mount 226 or vice versa. The function of such a flexure bearing is achieved for example by a region of reduced flexural rigidity, for example a resiliently deformable region with reduced material thickness, relative to two adjoining regions of higher flexural rigidity. The reduced flexural rigidity is thus brought about for example by a local reduction in cross section.

The optical element 202 is coupled to the base 400 with the aid of a bearing device 500. The bearing device 500 is what is known as a hexapod or can be referred to as a hexapod. The bearing device 500 permits a movement of the optical element 202 or the optically effective surface 224 in the six degrees of freedom. The bearing device 500 is preferably not operatively connected directly to the optical element 202 but rather to its mount 226.

Figure 4:
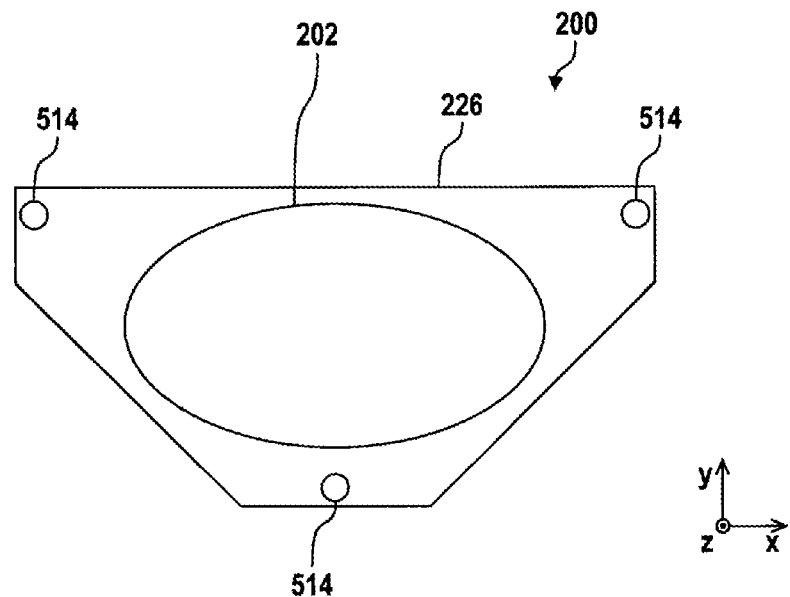
FIG. 4 shows a further schematic view of the optical system in accordance with FIG. 2.
Figure 5:
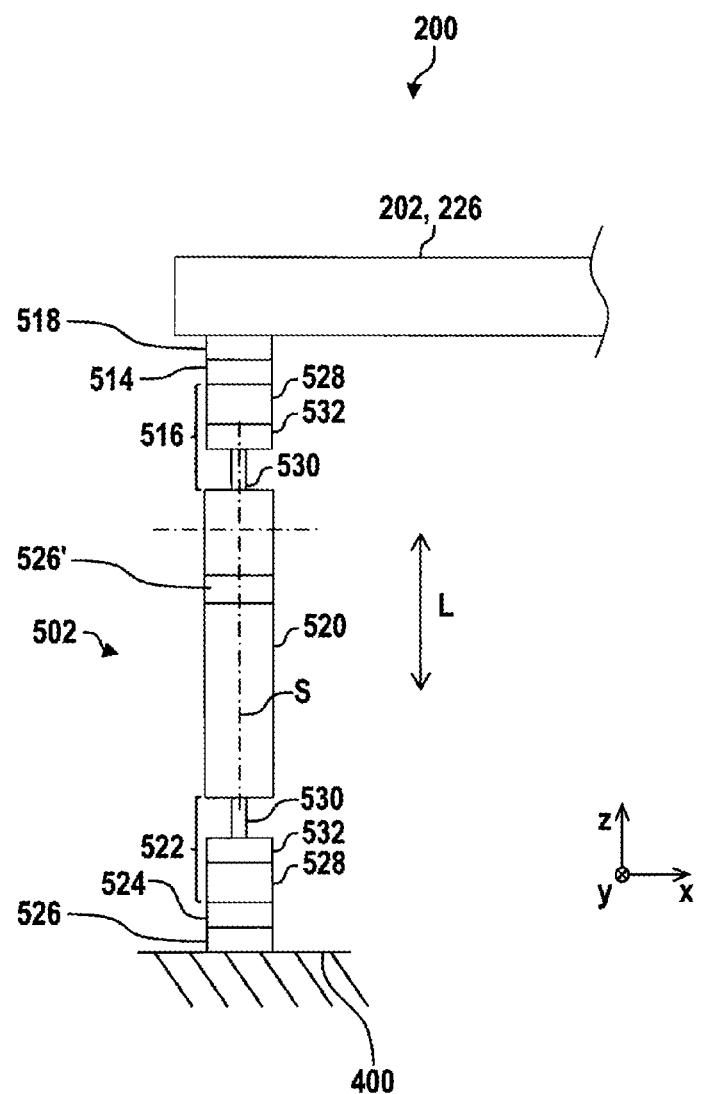
FIG. 5 shows a further schematic view of the optical system in accordance with FIG. 2.
Figure 6:
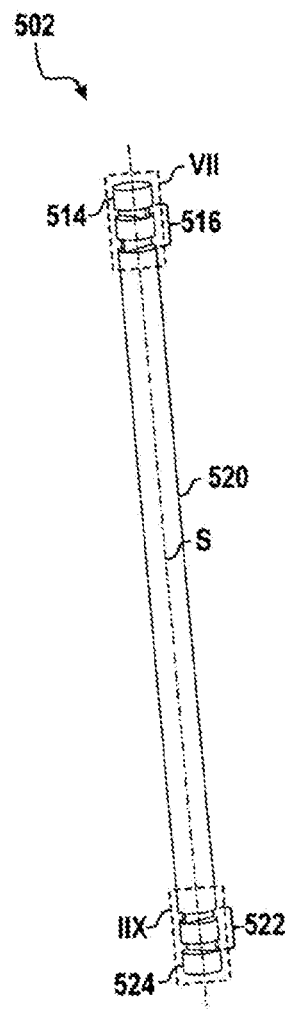
FIG. 6 shows a schematic perspective view of an embodiment of a bearing unit for the optical system in accordance with FIG. 2.

The bearing device 500 includes six bearing units 502, 504, 506, 508, 510, 512. The bearing units 502, 504, 506, 508, 510, 512 are rod-shaped and can be referred to as pins. The bearing units 502, 504, 506, 508, 510, 512 can engage in pairs via an adapter 514 assigned to the respective pair at the optical element 202, more precisely at its mount 226. As FIG. 4 shows, the adapters 514 can be located here, for example, at corner points of an imaginary triangle in a plan view of the optical element 202 or of the mount 226. FIG. 5 shows a possible embodiment of the bearing unit 502. However, the bearing units 504, 506, 508, 510, 512 can be constructed analogously. FIG. 6 shows a schematic perspective view of part of the bearing unit 502, and FIG. 7 and FIG. 8 each show detailed views VII and IIX, respectively, according to FIG. 6.

The bearing unit 502 includes a first bending decoupling element 516, which is operatively connected to the optical element 202 or to its mount 226 with the aid of the adapter 514. An optional spacer 518 can be provided between the adapter 514 and the optical element 202 or the mount 226. The spacer 518 may be a shim or be referred to as a shim. That is to say that the adapter 514 is connected to the optical element 202 or the mount 226 via the spacer 518. The adapter 514 can be referred to as the first adapter.

Spacers 518 with different gradations or granularities in terms of the extent of their lengths in relation to a longitudinal direction L of the bearing unit 502 can be kept available, from which a suitable spacer 518 is then selected. The granularity of the spacers 518 preferably 5 μm.

The first bending decoupling element 516 is connected to a pin section 520. The first bending decoupling element 516 is preferably formed in one piece, for example in one piece of material, with the pin section 520. The bearing unit 502 includes a second bending decoupling element 522 remote from the first bending decoupling element 516. The second bending decoupling element 522 is also preferably formed in one piece, for example in one piece of material, with the pin section 520. The pin section 520 includes a pin axis S, with respect to which the pin section 520 is constructed to be rotationally symmetrical. The longitudinal direction L is oriented parallel to the pin axis S.

A further adapter 524 is provided between the second bending decoupling element 522 and the base 400. An actuating element 526 is in turn positioned between the adapter 524 and the base 400. The actuating element 526 can likewise be referred to as an actuator. The actuating element 526 permits a linear movement along the longitudinal direction L of the bearing unit 502. The actuating element 526 can therefore be referred to as a linear actuating element or linear actuator. The longitudinal direction L can coincide with the z-direction or be parallel to it. The adapter 524 can be referred to as a second adapter. The first adapter 514, the first bending decoupling element 516, the pin section 520, the second bending decoupling element 522, and the second adapter 524 are preferably formed in one piece, for example in one piece of material. The bending decoupling elements 516, 522 preferably are flexure bearings or include flexure bearings.

The actuating element 526 can alternatively also be positioned between the bending decoupling elements 516, 522, as denoted in FIG. 5 by the reference sign 526'. Furthermore, the actuating element 526 can also be positioned between the adapter 514 and the spacer 518 or between the spacer 518 and the optical element 202 or the mount 226. The spacer 518 in turn can alternatively also be positioned between the adapter 524 and the base 400, between the base 400 and the actuating element 526, or between the actuating element 526 and the adapter 524.

Figure 7:
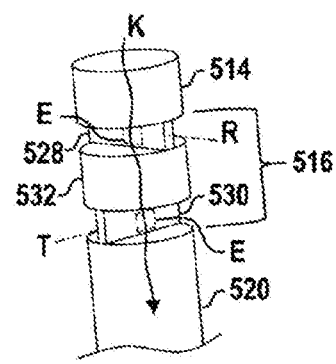
FIG. 7 shows the detail view VII in accordance with FIG. 6.

The first bending decoupling element 516 is shown in FIGS. 6 and 7 in each case in a perspective view. The first bending decoupling element 516 includes two leaf spring sections 528, 530, which are connected to one another via a connecting section 532. The leaf spring sections 528, 530 and the connecting section 532 can be manufactured as an integral component, for example from metal.

Each of the leaf spring sections 528, 530 has a plane E of principal extent. The planes E of principal extent are perpendicular to one another. Thus, for example, in an undeflected state of the bearing unit 502, a perpendicular to the plane E of principal extent of the leaf spring section 528 can point in the y-direction y, and a perpendicular to the plane E of principal extent of the leaf spring section 530 can point in the x-direction x. Consequently, the first bending decoupling element 516 has a flexibility that allows the pin section 520 to pivot both about the x-direction x and about the y-direction y. The x-direction x and the y-direction y are perpendicular to each other and in each case perpendicular to the z-direction z. Corresponding bending axes of the leaf spring sections 528, 530 are denoted by R and T and, as mentioned, can coincide with the directions x and y.

A power flow K through the first bending decoupling element 516 flows successively through the two leaf spring sections 528, 530, as shown in FIG. 7. That is to say, the leaf spring sections 528, 530 are mechanically connected in series. This causes the aforementioned flexibility about two mutually orthogonal axes, namely the axes R and T in this case, to be provided.

Figure 8:
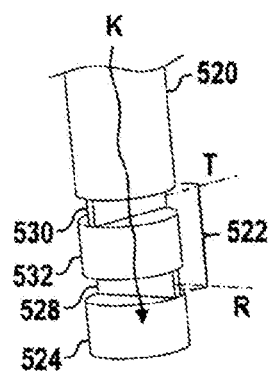
FIG. 8 shows the detail view IIX in accordance with FIG. 6.

The first bending decoupling element 516 is arranged on an end of the pin section 520 facing the optical element 202. The second bending decoupling element 522 is arranged opposite thereto, at the other end of the pin section 520. The second bending decoupling element 522 has an identical construction to the first bending decoupling element 516, which is shown in FIG. 8.

Due to this arrangement of the bending decoupling elements 516, 522 and the pin section 520 located therebetween, a movement of the optical element 202 can be brought about that leads to only small bends in the leaf spring sections 528, 530 in the bending decoupling elements 516, 522 even for large movement distances. This can be advantageous, for example, in the view of consequently only little heat being released there, the heat, in turn, possibly having a damaging effect in the form of thermal expansions. Furthermore, due to the bending decoupling elements 516, 522, the bearing unit 502 can only transmit forces that act exclusively along the longitudinal direction L or the pin axis S.

Returning now to the actuating element 526, this can in each case bring about a translational movement along the respective pin axis S of the bearing units 502, 504, 506, 508, 510, 512. The actuating element 526 can be or include a threaded spindle that is adjustable manually or by motor. Furthermore, the actuating element 526 can also include a hydraulic or pneumatic drive. Alternatively, the actuating element 526 can also be or include a piezoelectric drive. The driving can take place in this case directly or via a solid-state gear to optimize force, travel and actuating accuracy. The actuating element 526 can furthermore include a piezoelectric walk drive, which can be combined with a solid-state gear to optimize force, travel and actuating accuracy.

Figure 9:
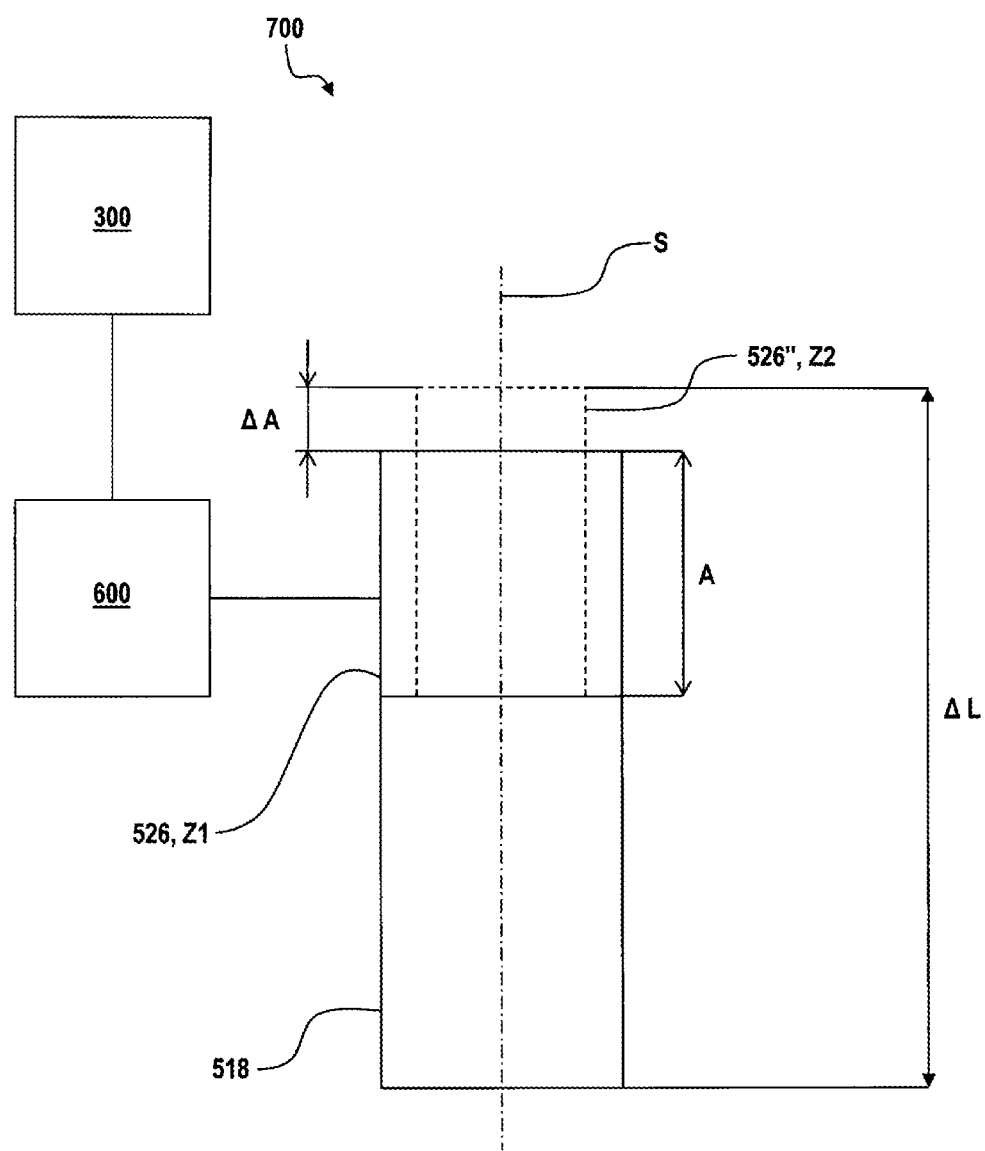
FIG. 9 shows a schematic view of an adjustment device for the optical system in accordance with FIG. 2.

As shown in FIG. 9, the actuating element 526 is preferably a piezo element or includes one or more piezo elements. When a voltage is applied to a piezoceramic, it changes in length. A further effect in the case of piezoceramics is that they also undergo a change in length in the case of a polarization. This change in length is permanent and can only be changed by changing the polarization. This means that after the length has changed, no more introduction of energy is used to maintain the change in length. This also means that no heat that has to be dissipated is generated.

For example, the actuating element 526 can have an actuation range $\Delta A$ of 10 µm. The maximum change in length, that is, the actuation range $\Delta A$, of a piezoceramic is approximately 0.1% of its initial length A. For an actuation range $\Delta A$ of 10 µm, the actuating element 526 therefore has an initial length A of approximately 10 mm. The positioning accuracy of the actuating element 526 is here 0.1 µm. The use of a piezoceramic for the actuating element 526 has the following advantages. No components that are movable relative to one another are involved. This prevents the components from seizing. After the desired change in length has been set, no energy supply is used for the actuating element 526, which means that no heat needs to be generated either. Furthermore, no separate sensor system is used in or on the actuating element 526, since the field position and the pupil position can be measured directly with the aid of the measurement system 300.

A control unit 600 is assigned to the actuating element 526 for energizing the latter. The control unit 600 can be part of the optical system 200. The actuating element 526 can be brought from an undeflected state Z1 to a deflected state Z2 and vice versa with the aid of the control unit 600. In the deflected state Z2, the actuating element is denoted in FIG. 9 with the reference sign 526". As mentioned above, the actuating element 526 is energized only to move it from the undeflected state Z1 to the deflected state Z2. Outside of that, the control element 526 is not energized. This means that no current is used to maintain the deflected state Z2. The actuation range $\Delta A$ is continuously settable. That is to say, the actuating element 526 can be brought continuously into any number of intermediate states between the undeflected state Z1 and the deflected state Z2.

After the adjustment element 526 has been polarized, the control unit 600 can be removed again. Alternatively, the control unit 600 can also be a fixed constituent part of the optical system 200. Each actuating element 526 of the bearing devices 502, 504, 506, 508, 510, 512 can be assigned such a control unit 600. Alternatively, all the actuating elements 526 of the bearing units 502, 504, 506, 508, 510, 512 can be controlled by a common control unit 600.

An actuating element 526 as shown in FIG. 9 can also be what is known as a piezo crawler or include a piezo crawler. A "piezo crawler" is a linear arrangement of interconnected piezo actuators or a piezo stack that can move on a surface by alternating activation of the piezo actuators in the manner of a crawler chain. Such a piezo crawler is preferably self-locking, which means that it does not independently reset in the absence of current. Since the actuating element 526 is in this case designed as a piezo crawler, it can be brought continuously from the undeflected state Z1 to the deflected state Z2 by way of energization. No current is then required to hold the deflected state Z2, as mentioned above.

The control unit 600 is preferably operatively connected to the measurement system 300, with the result that the control unit 600 can control the actuating elements 526 in dependence on measurement values of the measurement system 300, that is to say in dependence on the measured field position and the measured pupil position. The control unit 600, the measurement system 300, and the actuating element 526 are part of an adjustment device 700. The control unit 600 or the adjustment device 700 is suitable for changing the position and/or orientation of each of the optical elements 202, 204, 206, 208 to bring the optical elements 202, 204, 206, 208 from their respective actual location IL to the desired target location SL and to hold them in the latter.

Such an adjustment device 700 can be assigned to each bearing unit 502, 504, 506, 508, 510, 512. However, preferably one adjustment device 700 is assigned to a plurality of bearing units 502, 504, 506, 508, 510, 512, for example to all bearing units 502, 504, 506, 508, 510, 512, of a bearing device 500. The adjustment device 700 can be part of the bearing device 500, or vice versa. Furthermore, such an adjustment device 700 can be assigned to each optical element 202, 204, 206, 208. Furthermore, one adjustment device 700 can also be assigned to a plurality of optical element 202, 204, 206, 208.

Figure 10:
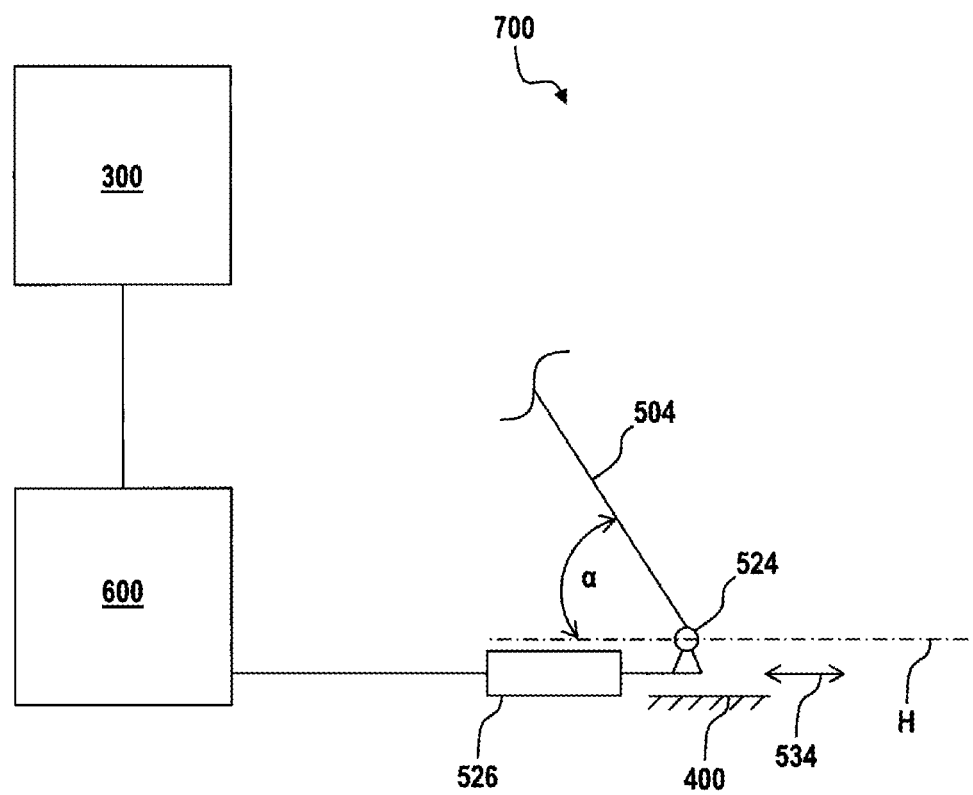
FIG. 10 shows a schematic view of of an adjustment device for the optical system in accordance with FIG. 2.

FIG. 10 shows a further embodiment of an adjustment device 700. In this embodiment of the adjustment device 700, the actuating element 526 is suitable for linearly displacing the adapter 524 of the respective bearing unit 502, 504, 506, 508, 510, 512 relative to the base 400 with the aid of a slide construction. In this way, an angle of inclination a of the respective bearing unit 502, 504, 506, 508, 510, 512 for example with respect to a horizontal H can be changed. However, FIG. 10 only shows the bearing unit 504. By way of example, the actuating element 526 could be formed as a piezo element or piezo crawler.

The linear displaceability is indicated in FIG. 10 with the aid of a double-headed arrow 534. The slide construction can be of self-locking design, with the result that it does not independently reset if the actuating element 526 is de-energized. The adjustment device 700 is thus suitable for changing the position and/or orientation of each of the optical elements 202, 204, 206, 208 to bring the optical elements 202, 204, 206, 208 from their respective actual location IL to the desired target location SL and to hold them in the latter with the aid of the linear displacement of the respective adapter 524. A variety of actuating elements 526 can also be combined with one another.

The functionality of the optical system 200 is explained below. Often, after some time in the exposure operation, it may be desirable to swap individual optical elements 202, 204, 206, 208. For example, tin can pass from the EUV light source 106A into the optical system 200 during the exposure operation. This can lead to degradation of the optically effective surface 224 of the optical elements 202, 204, 206, 208 or of individual ones of the optical elements 202, 204, 206, 208. The optical elements 202, 204, 206, 208 should advantageously be swapped without dismantling and installing the entire optical system 200, preferably on site, i.e. at the operating site of the EUV lithography apparatus 100A, and with the shortest possible downtime of the EUV lithography apparatus 100A.

Furthermore, it can also be desirable to adjust the optical elements 202, 204, 206, 208 during a heating phase of the optical system 200 in order to achieve an optimum field position and pupil position even during the heating phase. That is to say the exposure operation can advantageously already be started during the heating phase, and the expensive EUV radiation 108A can then be used not only for heating but for the exposure even during the heating phase. The heating phase can last a number of hours, for example one to five hours. The heating phase lasts for example until a thermal equilibrium of the optical system 200 due to incident EUV radiation 108A is attained. In the present case, "thermal equilibrium" should be understood to mean a state in which the temperature of the optical system 200 or of the optical elements 202, 204, 206, 208 no longer increases and for example remains constant. An equilibrium is then attained between any heat introduced, for example due to absorption of the EUV radiation 108A, and the heat that is removed, for example with the aid of a cooling system.

To adjust the field position and the pupil position, it is typically not enough to change just the tilt, i.e. the orientation, of the respective optical element 202, 204, 206, 208. In addition, it is also desirable to adapt the position of the respective optical element 202, 204, 206, 208. For example, when one of the optical elements 202, 204, 206, 208 is swapped at the operating site of the EUV lithography apparatus 100A, a quick and targeted adjustment is essential to attain the shortest possible downtime.

Figures 11, 12:
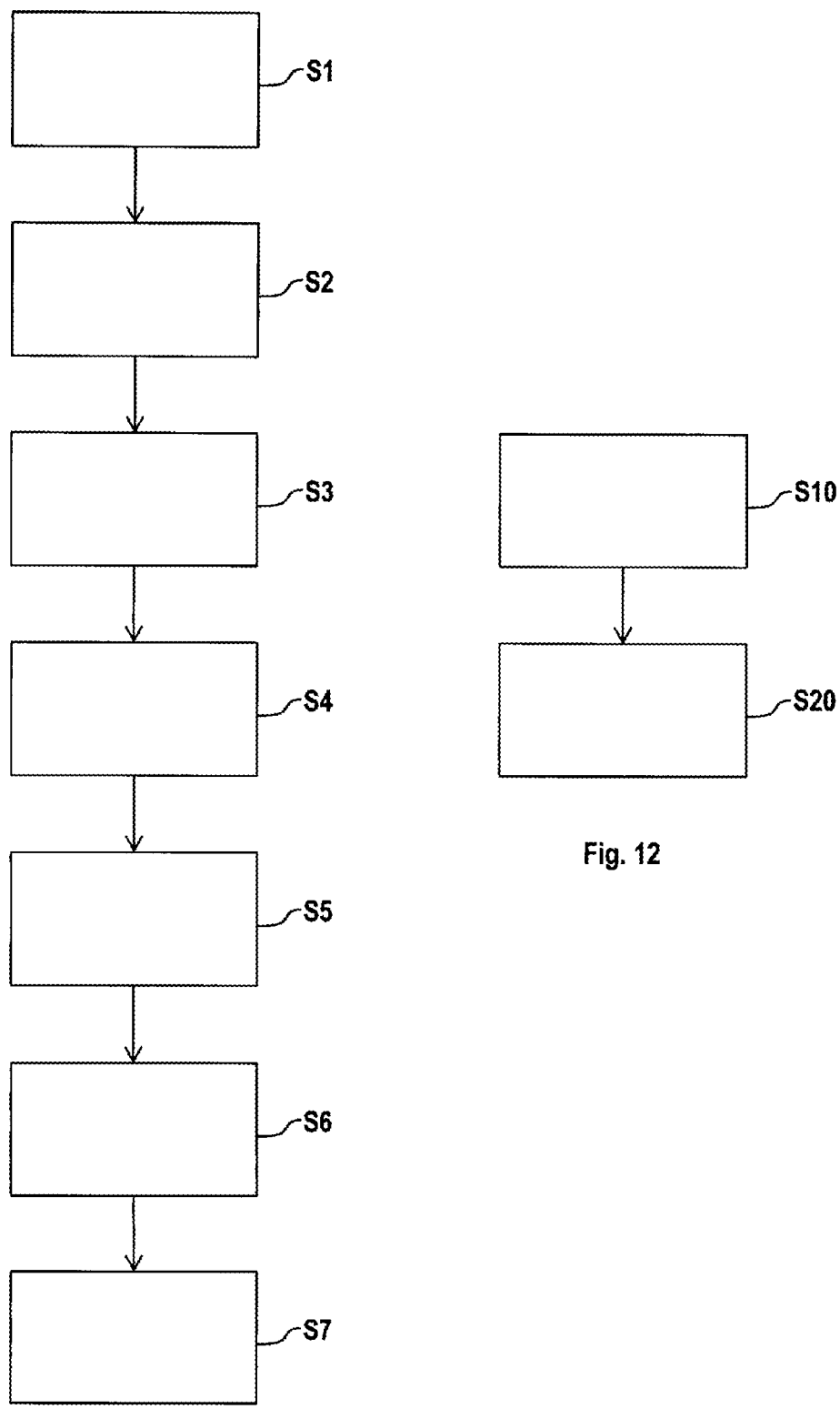
FIG. 11 shows a schematic block diagram of a method for adjusting the optical system in accordance with FIG. 2.
FIG. 12 shows a schematic block diagram of a method for adjusting the optical system in accordance with FIG. 2.

The adjustment of the optical elements 202, 204, 206, 208 or of one of the optical elements 202, 204, 206, 208 after one or more optical elements 202, 204, 206, 208 have been swapped can take place in accordance with a method for adjusting the optical system 200 shown in FIG. 11. In a step S1, the field position and the pupil position are measured for the optical system 200 initially still with the optical elements 202, 204, 206, 208 that were installed originally.

In a step S2, the desired optical element 202, 204, 206, 208 is swapped. In a step S3, the field position and the pupil position are measured again. Steps S1 to S3 are preferably carried out without a vacuum being applied to the housing 212.

In a subsequent step S4, a correction recipe is calculated. For this purpose, the measurement system 300 can include a computer unit or be coupled to a computer unit. The correction recipe includes a change in length $\Delta L$ (FIG. 9) along the pin axis S of the corresponding bearing units 502, 504, 506, 508, 510, 512 for the swapped optical element 202, 204, 206, 208 and possibly also for the optical elements 202, 204, 206, 208 that have not been swapped, which is used to bring the respective optical element 202, 204, 206, 208 from its actual location IL to its target location SL (FIG. 3). Such a change in length $\Delta L$ may be used for each of the bearing units 502, 504, 506, 508, 510, 512 or only for some of the bearing units 502, 504, 506, 508, 510, 512.

In two steps, S5 and S6, the desired correction is carried out on the swapped optical elements 202, 204, 206, 208 and possibly also on the optical elements 202, 204, 206, 208 that have not been swapped. The correction is preferably carried out in two stages. In step S5, an appropriate spacer 518 is inserted, which is selected from a plurality of spacers 518 with a length gradation of 5 µm. The change in length $\Delta L$ can thus be set with an accuracy of 5 µm with the aid of the spacer 518. After step S5 has been performed, a vacuum can be applied to the housing 212. In the event that the desired change in length $\Delta L$ is less than 5 µm, it is also possible to dispense with the insertion of the spacer 518.

In step S6, the actuating element 526 is now deflected to accurately set the change in length ΔL to 0.1 µm. The corresponding actuating element 526 is controlled with the aid of the control unit 600 for this purpose. Once the desired change in length ΔL has been attained, the actuating element 526 can be de-energized. Step S6 can already be carried out under a vacuum.

In a step S7, the field position and the pupil position are measured again. Steps S4, S6, and S7 are carried out, for example under a vacuum, iteratively until the desired specification with regard to the field position and the pupil position is achieved. The pupil position can also be ascertained via what is called the overlay on the wafer 124. The term "overlay" in the present case refers to the positioning accuracy or covering accuracy of structures from different manufacturing steps, generally of two photolithographic planes. That is to say the overlay can also be improved with the aid of the method. When the specification is achieved, the measurement system 300 and the control unit 600 can be removed. Alternatively, the measurement system 300 and the control unit 600 can also remain on the optical system 200.

The method can also be carried out for the initial adjustment during the assembly of the optical system 200. Furthermore, settling effects that can occur during transport of the optical system 200 can also be corrected with the aid of the method. This can be desirable because the size of the optical system 200 usually means it is tilted during transport. Furthermore, aging effects, such as creep effects or settling effects, of other components of the optical system 200 can be corrected. Thermal effects such as drifts that can occur after the machine has been adjusted can also be corrected.

Another method—shown in FIG. 12—can be suitable for shortening the downtime when the optical system 200 is put into operation, for example after one of the optical elements 202, 204, 206, 208 has been swapped, or for compensating for changes that occur as a result of a change in the illumination setting. This method according to FIG. 12 is preferably carried out under a vacuum and while the EUV light source 106A is in operation. In this method, the actuating element 526 is preferably designed as an active actuating element. The actuating element 526 can then be controlled with the aid of the control unit 600 in dependence on the field position and pupil position measured with the aid of the measurement system 300, in order to move the respective optical element 202, 204, 206, 208 from its actual location IL to the target location SL. The actuating element 526 is therefore part of a control loop that actively corrects the field position and the pupil position while adjusting the optical element 202, 204, 206, 208.

The method includes a step S10 of measuring the field position and the pupil position with the aid of the measurement system 300. In a step S20, the orientation and/or position of the optical element 202, 204, 206, 208 is adjusted during the heating phase of the optical system 200 in dependence on the measured field position and/or pupil position such that the optical element 202, 204, 206, 208 is always held in its target location SL. As long as the optical element 202, 204, 206, 208 is in the target location SL, the desired specifications for the field position and the pupil position can be met.

In step S20, a correction recipe for the optical element 202, 204, 206, 208 is also calculated. In step S20, the control unit 600 further controls the actuating element 526 in such a way that the optical element 202, 204, 206, 208 is brought from its actual location IL to the target location SL and is held in the target location SL. Steps S10, S20 are carried out iteratively until the desired specifications with regard to the field position and the pupil position are achieved.

The method according to FIG. 12 can be part of the method according to FIG. 11. The method according to FIG. 12 can for example also be carried out according to the method according to FIG. 11. In contrast to the method according to FIG. 11, the method according to FIG. 12 is carried out continuously during the heating phase of the optical system 200 with constant correction of the location of the optical element 202, 204, 206, 208. As a result, the exposure operation can already be started during the heating phase, as a result of which the downtime of the optical system 200, for example after one of the optical elements 202, 204, 206, 208 has been swapped, can be significantly reduced.

Although the present disclosure has been described on the basis of exemplary embodiments, it is modifiable in diverse ways.

LIST OF REFERENCE SIGNS

100A EUV lithography apparatus
100B DUV lithography apparatus
102 Beam-shaping and illumination system
104 Projection system
106A EUV light source
106B DUV light source
108A EUV radiation
108B DUV radiation
110 Mirror
112 Mirror
114 Mirror
116 Mirror
118 Mirror
120 Photomask
122 Mirror
124 Wafer
126 Optical axis
128 Lens element
130 Mirror
132 Medium
200 Optical system
202 Optical element
202' Optical element
204 Optical element
206 Optical element
208 Optical element
210 Deflection mirror
212 Housing
214 Intermediate focal plane
216 Beam path
218 Object plane
220 Object field
222 Substrate
224 Optically effective surface
224' Optically effective surface
226 Mount
300 Measurement system
400 Base
500 Bearing device
502 Bearing unit
504 Bearing unit
506 Bearing unit
508 Bearing unit
510 Bearing unit
512 Bearing unit
514 Adapter 516 Bending decoupling element
518 Spacer
520 Pin section
522 Bending decoupling element
524 Adapter
526 Actuating element
526' Actuating element
526" Actuating element
528 Leaf spring section
530 Leaf spring section
532 Connecting section
534 Double-headed arrow
600 Control unit
700 Adjustment device
A Initial length
E Plane of principal extent
IL Actual location
H Horizontal
K Power flow
L Longitudinal direction
M1 Mirror
M2 Mirror
M3 Mirror
M4 Mirror
M5 Mirror
M6 Mirror
R Bending axis
S Pin axis
SL Target location
S1 Step
S2 Step
S3 Step
S4 Step
S5 Step
S6 Step
S7 Step
S10 Step
S20 Step
T Bending axis
x x-direction
y y-direction
z z-direction
Z1 State
Z2 State
ΔA Actuation range
ΔL Change in length
α Angle of inclination

What is claimed is:

1. A beam-shaping and illumination system having an exposure phase and a heating phase which begins before the exposure phase, the beam-shaping and illumination system comprising:
an optical element; and
an adjustment device, comprising:
a control unit;
a sensor; and
an actuating element configured to adjust an orientation and/or a position of the optical element to keep the optical element in a target location,
wherein the control unit is operatively connected to the sensor and the actuating element so that, during the heating phase and before the exposure phase begins:
a) the sensor is located in an object plane of the beam-shaping and illumination unit along a beam path of the beam-shaping and illumination unit so that the sensor measures the field position and/or the pupil position of the beam-shaping and illumination system; and
b) based on the measured field position and/or pupil position of the beam-shaping and illumination system, the actuating element adjusts an orientation and/or a position of the optical element to keep the optical element in a target location.

2. The beam-shaping and illumination system of claim 1, further comprising a plurality of optical elements, wherein the adjustment device is configured to adjust an orientation and/or a position of the optical elements relative to one another depending on the measured field position and/or pupil position.

3. The beam-shaping and illumination system of claim 2, wherein the plurality of optical elements comprises a field facet mirror, a pupil facet mirror, and/or a condenser mirror.

4. The beam-shaping and illumination system of claim 1, further comprising a bearing device which comprises the actuating element.

5. The beam-shaping and illumination system of claim 4, wherein the bearing device comprises a hexapod.

6. The beam-shaping and illumination system of claim 4, wherein the actuating element comprises a piezo element.

7. The beam-shaping and illumination system of claim 4, wherein the bearing device comprises six bearing units, and each bearing unit comprises a corresponding actuating element.

8. The beam-shaping and illumination system of claim 7, wherein, for each bearing unit, the bearing unit comprises a spacer configured to change a length of the bearing unit.

9. The beam-shaping and illumination system of claim 7, wherein the system is configured so that changing a length of the bearing units adjusts the orientation and/or the position of the optical element.

10. The beam-shaping and illumination system of claim 7, wherein the actuating element is configured to change from an undeflected state to a deflected state, and the actuating element is without current both in the undeflected state and in the deflected state.

11. The beam-shaping and illumination system of claim 7, wherein for each bearing unit:
the bearing unit comprises:
a first bending decoupling element;
a second bending decoupling element; and
a pin section arranged between the first and second bending decoupling elements; and
the actuating element is between:
the first and second bending decoupling elements;
the first bending decoupling element and the optical element; or
the second bending decoupling element and a base of the beam-shaping and illumination system.

12. A lithography apparatus, comprising:
a beam-shaping and illumination system according to claim 1.

13. The lithography apparatus of claim 12, wherein the lithography apparatus is an EUV lithography apparatus.

14. A beam-shaping and illumination system having an exposure phase and a heating phase which begins before the exposure phase, the beam-shaping and illumination system comprising:
an optical element;
an adjustment device, comprising:
a control unit;
a sensor; and
a bearing device comprising six bearing units, wherein:
for each bearing unit, the bearing unit comprises:
an actuating element controllable by the adjustment device; and
a spacer configured to change a length of the bearing unit;
the system is configured so that changing a length of the bearing units adjusts an orientation and/or a position of the optical element; and
the control unit is operatively connected to the sensor and the bearing device so that, during the heating phase and before the exposure phase begins:
a) the sensor is located in an object plane of the beam-shaping and illumination unit along a beam path of the beam-shaping and illumination unit so that the sensor measures the field position and/or the pupil position of the beam-shaping and illumination system; and
b) based on the measured field position and/or pupil position of the beam-shaping and illumination system, the bearing device adjusts an orientation and/or a position of the optical element to keep the optical element in a target location.

15. A method of operating a beam-shaping and illumination system having an exposure phase and a heating phase which begins before the exposure phase, the method comprising:
during the heating phase and before the exposure phase begins:
a) using a sensor located in an object plane of the beam-shaping and illumination unit along a beam path of the beam-shaping and illumination unit to measure a field position and/or a pupil position of the beam-shaping and illumination system; and
b) based on the measured field position and/or pupil position, adjusting an orientation and/or a position of an optical element of the beam-shaping and illumination system.

16. The method of claim 15, wherein a) and b) are iteratively performed until the field position and/or the pupil position meet a desired specification.

17. The method of claim 15, further comprising, before or during b), calculating a correction recipe for the optical element, wherein the optical element is adjusted based on this correction recipe.

18. The method of claim 15, wherein the method is carried out under vacuum and/or during the operation of an EUV light source of the beam-shaping and illumination system.

19. The method of claim 15, wherein b) comprises adjusting the orientation and/or the position of the optical element by, in each case, changing a length of bearing units of a bearing device of the optical element.

20. The method of claim 15, comprising performing the method to attain a thermal equilibrium of the beam-shaping and illumination system.

* * * * *

UNITED STATES PATENT AND TRADEMARK OFFICE
CERTIFICATE OF CORRECTION

PATENT NO. : 11,448,968 B2
APPLICATION NO. : 17/019931
DATED : September 20, 2022
INVENTOR(S) : Hubert Holderer, Klaus Abele and Björn Liebaug It is certified that error appears in the above-identified patent and that said Letters Patent is hereby corrected as shown below:

In the Specification

Column 9, Line 12, delete "of of" insert --of--.

Column 9, Line 14, delete "of of" insert --of--.

Column 9, Line 32, delete "of of" insert --of--.

Column 9, Line 56-60, delete "The vacuum housings are surrounded by a machine room, in which drive devices for mechanically moving or setting optical elements are provided. Moreover, electrical controllers and the like can also be provided in this machine room." insert the same on Column 9, Line 57 as a new paragraph.

Column 14, Line 41, delete "preferably" insert --is preferably--.

Column 17, Line 37, delete "a" insert --α--.

Signed and Sealed this
Twentieth Day of December, 2022

Katherine Kelly Vidal
*Director of the United States Patent and Trademark Office*